United States Patent
Karthaus

(10) Patent No.: US 8,912,846 B2
(45) Date of Patent: Dec. 16, 2014

(54) DOHERTY AMPLIFIER ARRANGEMENT

(75) Inventor: Udo Karthaus, Nue-Ulm (DE)

(73) Assignee: Kathrein-Werke KG, Rosenheim (DE)

(*) Notice: Subject to any disclaimer, the term of this patent is extended or adjusted under 35 U.S.C. 154(b) by 760 days.

(21) Appl. No.: 13/190,063

(22) Filed: Jul. 25, 2011

(65) Prior Publication Data

US 2013/0027272 A1    Jan. 31, 2013

(51) Int. Cl.
*H03F 3/68* (2006.01)
*H03F 3/60* (2006.01)
*H01Q 1/24* (2006.01)
*H01Q 7/00* (2006.01)
*H01Q 23/00* (2006.01)
*H03F 1/02* (2006.01)

(52) U.S. Cl.
CPC .............. *H03F 3/602* (2013.01); *H01Q 1/246* (2013.01); *H01Q 7/00* (2013.01); *H01Q 23/00* (2013.01); *H03F 1/0288* (2013.01); *H03F 2200/405* (2013.01)
USPC ...................... 330/124 R; 330/295

(58) Field of Classification Search
CPC ................................. H03F 1/07; H03F 1/0288
USPC ............................. 330/124 R, 295
See application file for complete search history.

(56) References Cited

U.S. PATENT DOCUMENTS

| 2,658,959 | A | 11/1953 | Doherty |
| 2006/0044060 | A1* | 3/2006 | Shiikuma ............... 330/124 R |
| 2009/0179702 | A1 | 7/2009 | Blednov |

OTHER PUBLICATIONS

Doherty, A New High-Efficiency Power Amplifier for Modulated Waves, Bell System Technical Journal, 1936, pp. 469-475.
Wongkomet, A +31.5 DBM CMOS RF Doherty Power Amplifier for Wireless Communications, IEEE Journal of Solid-State Ciruicts, vol. 41, No. 12, Dec. 2006, pp. 2852-2859.

* cited by examiner

*Primary Examiner* — Robert Pascal
*Assistant Examiner* — Khiem Nguyen
(74) *Attorney, Agent, or Firm* — Stephen H. Eland; Dann, Dorfman, Herrell & Skillman

(57) ABSTRACT

A Doherty amplifier (1) is described which comprises an input terminal (102) for receiving an input signal (101) and an output terminal (103) for providing an amplified signal (104) of the input signal (101). The Doherty amplifier (1) comprises a carrier amplifier stage (300) with a first signal input (311) and a second signal input (312) and a peak amplifier stage (400) with a third signal input (411) and a fourth signal input (421). A signal splitter (200) splits and delays the input signal (101) so that the signal at the first signal input (311) and the signal at the second signal input (321) are 180° apart in phase and that the signal at the third signal input (421) and the fourth signal input (431) are also 180° apart in phase.

13 Claims, 3 Drawing Sheets

DOHERTY AMPLIFIER ARRANGEMENT

CROSS-REFERENCE TO RELATED APPLICATIONS

None

FIELD OF THE INVENTION

This field of the present application relates in general to a Doherty amplifier and to an active antenna arrangement comprising at least the Doherty amplifier. The field of the application also relates to a method of manufacturing a chipset with a Doherty amplifier and a computer program product for manufacturing a Doherty amplifier.

BACKGROUND OF THE INVENTION

The use of mobile communications networks has increased over the last decade. Operators of the mobile communications networks have increased the number of base stations in order to meet an increased demand for service by users of the mobile communications networks. The operators of the mobile communications network wish to purchase components for the base stations at a lower price and also wish to reduce the running costs of the base station. Active antenna arrangements with Doherty Amplifiers have proven to meet these goals.

The Doherty amplifier is first known from U.S. Pat. No. 2,658,959 as an efficiency improved amplifier arrangement made of vacuum tubes for modulated signals. Since then the name Doherty amplifier has been recognized in the industry to refer to two parallel amplifier stages (vacuum tubes which were subsequently substituted by transistors), whereby a first amplifier stage operates in class AB mode and a second amplifier stage operates in class C mode. Usually the first stage is biased in such a way that the first amplifier stage linearly amplifies the input signal of the first amplifier stage from zero excitation to carrier level. The first amplifier stage is therefore also called carrier amplifier.

The second amplifier stage is biased in such a way that the second amplifier stage amplifies input signals above a certain threshold, i.e. input signals above the carrier level. Therefore the second amplifier stage is usually called peak amplifier. In order to improve load balancing, the input signals of both the first amplifier stage and the second amplifier stage are shifted in phase so that the phase difference between the input signals of the first amplifier stage and the second amplifier stage is 90 degrees apart. In this way the phase of the output signals of the carrier amplifier (first amplifier stage) and the peak stage (second amplifier stage) are also 90 degrees apart. In order to form the output signal of the Doherty amplifier the phase shifted output signals are recombined in-phase.

In the original U.S. Pat. No. 2,658,959 the phase shifting between the input signal of the carrier amplifier and the input signal of the peak stage was achieved by a LC-voltage divider located between the input of the amplifier arrangement and the input of the carrier amplifier; and a LC-voltage divider located between the input of the carrier amplifier and the input of the peak amplifier. As a result of this arrangement one input signal was retarded by 45 degrees in relation to the input signal of the amplifier. In contrast hereto the input signal of the other amplifier was advanced 45 degrees in relation to the input signal. The overall effect was to make both the carrier amplifier and the peak amplifier work at a phase difference of 90 degrees.

In the paper "A New High-Efficiency Power Amplifier for Modulated Waves", Bell Telephone System Technical Publications B-931 in 1936, Doherty also describes the use of 90 degree networks. FIG. 9 in this paper depicts two different applications. In the first application the input signal of the Doherty amplifier is passed through a −90 degree network before the input signal is fed to the input of the first amplifier stage, whereas the input signal of the Doherty amplifier is fed directly to the input of the second amplifier stage, without applying any phase changes. A second −90 degree network at the output of the second amplifier stage retards the output of the second amplifier stage, so that the output signal of first amplifier stage and the output signal of the second amplifier stage after the second −90 degree network are in-phase and can be re-combined. A second application depicted in the said figure shows how to use a negative shifting 90 degree network at the input and a positive 90 degree shifting network at the output of the same amplifier stage. By this arrangement the phase difference within the same amplifier stage is compensated and the signals of the first amplifier stage and the second amplifier stage can be re-combined in-phase.

The amplifier stages of a Doherty amplifier may be formed by bipolar transistors or field effect transistors (FET). US Patent Application Publication 2009/0179702 A1 shows a Doherty amplifier arrangement comprising first and second bipolar bipolar transistors, as well as first and second bipolar field effect transistors.

Further in Naratip Wongkomet, "A +31.5 dBm CMOS RF Doherty Power Amplifier for Wireless Communications", IEEE Journal of solid-state circuits, vol. 41, 2006, pp 2852-2859, a differential Doherty amplifier in CMOS technology is described, that was designed for operate in the DCS-1800 band for both GSM and GSM/EDGE. The Doherty amplifier, presented in this paper, consists of a main signal path and a auxiliary signal path. The main signal path has an impedance inverter network, which gives 90° phase shift at the output. To equalize the delay of the two signal paths, a polyphase circuit is used as a phase shifter network at the inputs of the two amplifiers. The polyphase circuit is a RC-CR ladder which gives 90° phase difference at its two outputs. The main amplifier and the auxiliary amplifier both are differential amplifiers with differential inputs and differential outputs. The differential outputs of the main amplifier and the differential outputs of the auxiliary amplifier are fed into a symmetrical, passive impedance inversion network.

All components are integrated on a single CMOS die except for a capacitor in the output matching networks and baluns. In order to facilitate high integration a lumped element pi network consisting of a first capacitor, a spiral inductor, and a second capacitor is used to provide for the impedance inversion function. An output matching network consists of a pair of bondwires and the off-chip capacitor to transform the 50-Ω load impedance to approximately 8-Ω differential.

SUMMARY OF THE INVENTION

It is an aspect of the teachings of the present disclosure to provide a Doherty amplifier arrangement that provides a larger bandwidth compared to known Doherty amplifiers. The Doherty amplifier arrangement according to the teachings disclosed herein comprises an input terminal for receiving an input signal and an output terminal for providing an amplified signal of the input signal. The Doherty amplifier arrangement further comprises a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component. The Doherty amplifier arrangement further comprises a carrier amplifier comprising a first carrier amplifier input, a second carrier amplifier input, and at least a first carrier amplifier output for providing at least a first carrier amplifier output signal. The Doherty amplifier arrangement further comprises a peak amplifier, the peak amplifier comprising a first peak amplifier input, a second peak amplifier input, and at least a first peak amplifier output for providing at least a first peak amplifier output signal. The Doherty amplifier arrangement further comprises a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein the second inductor terminal is connected to the first capacitor terminal, the second capacitor terminal is connected to the third inductor terminal, the fourth inductor terminal is connected to the third capacitor terminal, the fourth capacitor terminal is connected to the first inductor terminal.

In an arrangement like proposed the signals provided at the first carrier amplifier input and the second carrier amplifier input are substantially 180° apart in phase and the signals provided at the first peak amplifier input and the second peak amplifier input are also substantially 180° apart in phase. Amplifying two signals that are substantially 180° apart in phase by the carrier amplifier and amplifying two signals that are substantially 180° apart in phase by the peak amplifier, renders the presented amplifier arrangement less sensitive to noise on the reference level and enables the Doherty amplifier arrangement to tolerate high reference level capacitor. This reduces the risk of oscillation or other performance degradation. In the presented Doherty amplifier arrangement the ring wise arranged first inductor, first capacitor, second inductor and second capacitor form a lumped LCLC power combiner. The presented Doherty amplifier can be relatively easily implemented on-chip due to this lumped LCLC power combiner. The lumped LCLC power combiner further enables load modulation over a wide frequency band, especially at low and medium power levels and a smooth gain-versa-power characteristic over a wide frequency range. The adjacent channel power ratio (ACPR) is improved in comparison to known Doherty amplifier arrangements and the electromagnetic compatibility (EMC) is low. This design of the Doherty amplifier arrangement also enables implementation of digital phase distortion (DPD).

Another aspect of the teachings of the present disclosure is that the carrier amplifier is a first differential amplifier comprising a first non-inverting input that corresponds to the first carrier amplifier input, the first differential amplifier further comprising a first inverting input that corresponds to the second carrier amplifier input the peak amplifier is a second differential amplifier comprising a second non-inverting input that corresponds to the first peak amplifier input, the second differential amplifier further comprising a second inverting input that corresponds to the second peak amplifier input.

By means of using differential amplifiers with differential inputs and differential outputs only a single carrier amplifier is needed for amplifying a non-inverted carrier amplifier signal and an inverted carrier amplifier signal and only a single peak amplifier is needed for amplifying a non-inverted peak amplifier signal and an inverted peak amplifier signal.

Another aspect of the teachings of the present disclosure is that the carrier amplifier comprises a first carrier amplifier device providing a first carrier amplifier output and the carrier amplifier further comprises a second carrier amplifier device providing a second carrier amplifier output. The peak amplifier comprises a first peak amplifier device providing a first peak amplifier output and the peak amplifier further comprises a second peak amplifier device, providing a second peak amplifier output.

In this aspect of the present disclosure instead of providing a differential amplifier for the carrier amplifier and a differential amplifier for the peak amplifier the carrier amplifier comprises two separate amplifiers and the peak amplifier also comprises two separate amplifiers.

Another aspect of the present disclosure is that the amplifier arrangement further comprises a differential antenna with a first antenna input and a second antenna input whereby the first antenna input is either connected to the first capacitor terminal and the second antenna input is connected to the third capacitor terminal or the first antenna input is connected to the second capacitor terminal and the second antenna input is connected to the fourth capacitor terminal.

By using a differential antenna, such as an antenna with two symmetrical inputs the antenna can be directly connected to the signal combiner without the need of transforming a balanced output signal to an unbalanced output signal, which would be needed by an asymmetric antenna, like a rod antenna.

Another aspect of the present disclosure is that the amplifier arrangement further comprises a 180°-combiner with a first 180°-combiner input and a second 180°-combiner input whereby the first 180°-combiner input is either connected to the first capacitor terminal and the second 180°-combiner input is connected to the third capacitor terminal or the first antenna input is connected to the second inductor terminal and the second antenna input is connected to the fourth inductor terminal.

With the signal combiner the symmetric output signals of the amplifier arrangement is re-combined to an asymmetric output signal.

Another aspect of the present disclosure is that the 180°-combiner is one of a impedance matching network, a 180°-hybrid coupler, or a balun.

Another aspect of the present disclosure is that the signal combiner balun comprises a first signal combiner balun input, a second combiner balun input and a signal combiner balun output, wherein the first signal combiner balun input is connected to one of the first capacitor terminal or the second capacitor terminal and wherein the second signal combiner balun input is connected to one of the third capacitor terminal or the fourth capacitor terminal.

Another aspect of the present disclosure is that the balun is implemented as one of a band-pass filter with a differential band-pass filter input and a single ended band-pass filter output or a impedance transformer with a differential impedance transformer input and a single-ended impedance transformer output.

Another aspect of the present disclosure is a method for amplifying a radio signal by a Doherty amplifier. The method comprises splitting the radio signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component. The method further comprises amplifying the first signal component by a carrier amplifier providing a first amplified carrier signal and amplifying the third signal component by the carrier amplifier providing a second amplified carrier signal. The method further comprises amplifying the second signal component by a peak amplifier providing a first amplified peak signal and amplifying the fourth signal component providing a second amplified peak signal. The method further comprises combining the first amplified carrier signal, the second amplified carrier signal, the first amplified peak signal, and the second amplified peak signal in-phase by a circular arrangement of a first inductor, a first capacitor, a second inductor, and a second capacitor.

Another aspect of the present disclosure is a chip set comprising a Doherty amplifier arrangement having an input terminal for receiving an input signal and having at least one output terminal for providing an amplified signal of the input signal, the Doherty amplifier arrangement further comprises a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component. The Doherty amplifier arrangement further comprises a carrier amplifier comprising a first carrier amplifier input, a second carrier amplifier input, and at least a first carrier amplifier output for providing at least a first carrier amplifier output signal. The Doherty amplifier arrangement further comprises a peak amplifier, the peak amplifier comprising a first peak amplifier input, a second peak amplifier input, and at least a first peak amplifier output for providing at least a first peak amplifier output signal. The Doherty amplifier arrangement further comprises a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein the second inductor terminal is connected to the first capacitor terminal, the second capacitor terminal is connected to the third inductor terminal, the fourth inductor terminal is connected to the third capacitor terminal, the fourth capacitor terminal is connected to the first inductor terminal.

Another aspect of the present disclosure is an active antenna array comprising at least one Doherty amplifier arrangement, the at least one Doherty amplifier arrangement having an input terminal for receiving an input signal and having at least one output terminal for providing an amplified signal of the input signal. The Doherty amplifier arrangement further comprises a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component. The Doherty amplifier arrangement further comprises a carrier amplifier, the carrier amplifier comprises a first carrier amplifier input, a second carrier amplifier input, and at least a first carrier amplifier output for providing at least a first carrier amplifier output signal. The Doherty amplifier arrangement further comprises a peak amplifier, the peak amplifier comprises a first peak amplifier input, a second peak amplifier input, and at least a first peak amplifier output for providing at least a first peak amplifier output signal. The Doherty amplifier arrangement further comprises a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein the second inductor terminal is connected to the first capacitor terminal, the second capacitor terminal is connected to the third inductor terminal, the fourth inductor terminal is connected to the third capacitor terminal, the fourth capacitor terminal is connected to the first inductor terminal.

Another aspect of the teaching of this application is a method for manufacturing a Doherty amplifier, the Doherty amplifier arrangement having an input terminal for receiving an input signal and having at least one output terminal for providing an amplified signal of the input signal. The Doherty amplifier arrangement further comprises a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component. The Doherty amplifier arrangement further comprises a carrier amplifier, the carrier amplifier comprises a first carrier amplifier input, a second carrier amplifier input, and at least a first carrier amplifier output for providing at least a first carrier amplifier output signal. The Doherty amplifier arrangement further comprises a peak amplifier, the peak amplifier comprises a first peak amplifier input, a second peak amplifier input, and at least a first peak amplifier output for providing at least a first peak amplifier output signal. The Doherty amplifier arrangement further comprises a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein the second inductor terminal is connected to the first capacitor terminal, the second capacitor terminal is connected to the third inductor terminal, the fourth inductor terminal is connected to the third capacitor terminal, the fourth capacitor terminal is connected to the first inductor terminal.

Another aspect of the teaching of the present disclosure is a computer program product comprising a non-transitory computer-usable medium having control logic stored therein for causing a computer to manufacture a Doherty amplifier having an input terminal for receiving an input signal and having an output terminal for providing an amplified signal of the input signal. The Doherty amplifier arrangement further comprises a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component. The Doherty amplifier arrangement further comprises a carrier amplifier, the carrier amplifier comprises a first carrier amplifier input, a second carrier amplifier input, and at least a first carrier amplifier output for providing at least a first carrier amplifier output signal. The Doherty amplifier arrangement further comprises a peak amplifier; the peak amplifier comprises a first peak amplifier input, a second peak amplifier input, and at least a first peak amplifier output for providing at least a first peak amplifier output signal. The Doherty amplifier arrangement further comprises a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein the second inductor terminal is connected to the first capacitor terminal, the second capacitor terminal is connected to the third inductor terminal, the fourth inductor terminal is connected to the third capacitor terminal, the fourth capacitor terminal is connected to the first inductor terminal.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
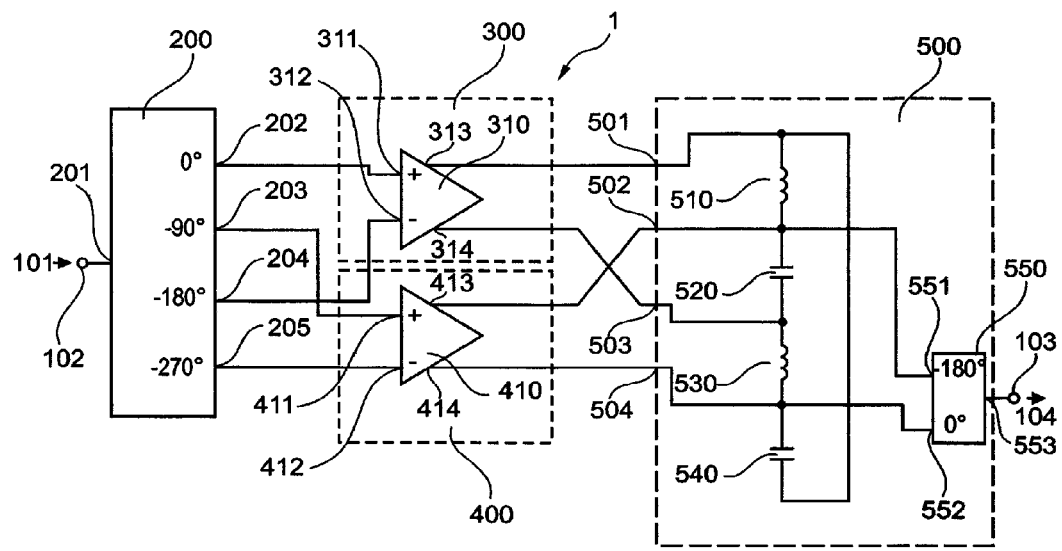
FIG. 1 shows a first aspect of the Doherty amplifier according to the present disclosure

FIG. 1 shows a first aspect of the Doherty amplifier arrangement 1 according to the present disclosure. The Doherty amplifier arrangement 1 comprises a signal splitter 200, a carrier amplifier stage 300, a peak amplifier stage 400 and a signal combiner 500. The Doherty amplifier 1 is adapted to amplify a modulated radio signal 101 received at a Doherty amplifier input 102 and to provide an amplified radio signal 104 at a Doherty amplifier output 103.

A signal splitter input 201 is connected to the Doherty amplifier arrangement input 102 for receiving the radio signal 101. The signal splitter 200 splits the radio signal 101 into a first signal component provided at a first signal splitter output 202, a second signal component provided at a second signal splitter output 203, a third signal component provided at a third signal splitter output 204 and a fourth signal component provided at a fourth signal splitter output 205. The first signal component, the second signal component, the third signal component, and the fourth signal component are identical apart from a difference in their phase: the second signal component shows ideally a phase delay of 90° in relation to the first signal component, the third signal component shows ideally a phase delay of 180° in relation to the first signal component, and the fourth signal component shows ideally a phase delay of 270° in relation to the first signal component.

Figure 3:
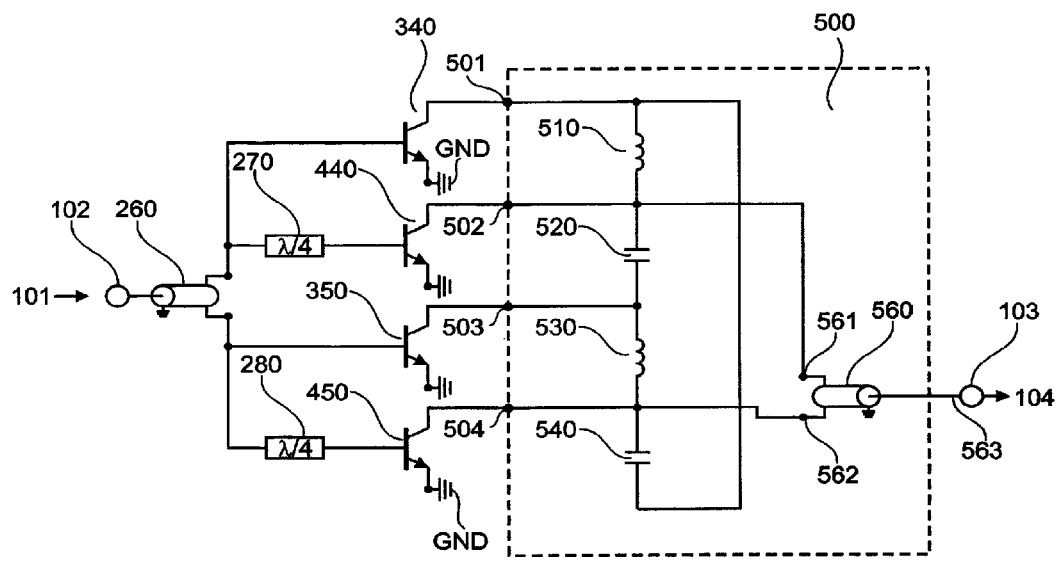
FIG. 3 shows yet another aspect of the Doherty amplifier according to the present disclosure
Figure 4:
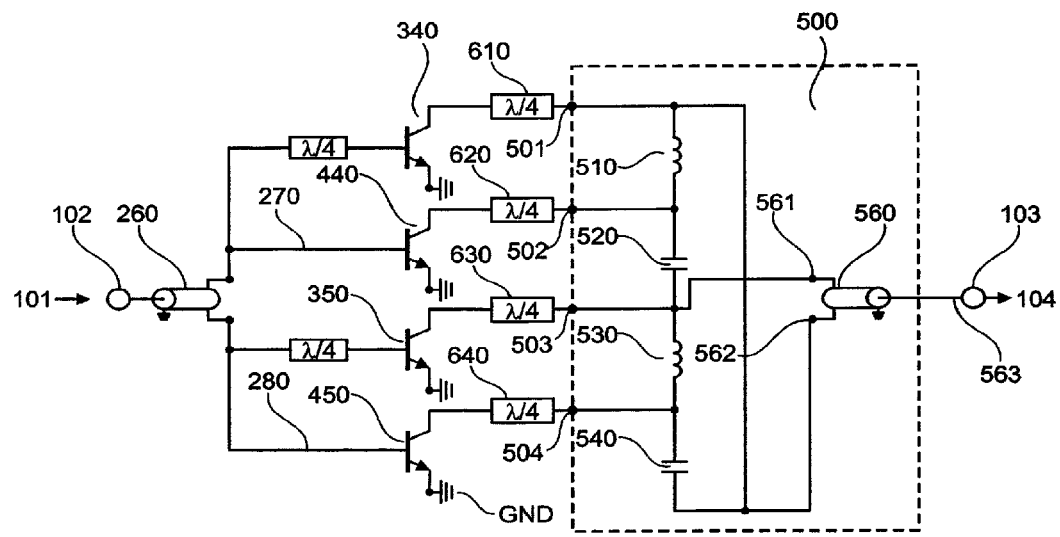
FIG. 4 shows yet another aspect of the Doherty amplifier according to the present disclosure

As the signal splitter 200 is composed of real world circuit elements in reality the phase difference may slightly differ from the ideal values due to imperfections of the circuit elements. The person skilled in the art will appreciate that for the design of the Doherty amplifier arrangement 1 of the present disclosure the phase relations between the first component signal, the second component signal, the third component signal, and the fourth component signal are more crucial than the actual total delay for a signal passing the signal splitter 200. The person skilled in the art will also appreciate that the signal splitter may be composed of separate elements, such as combinations of 90° hybrids and 180° hybrids, or as shown in FIG. 3 and FIG. 4 as 90° delay lines and baluns.

In the aspect of the present disclosure the carrier amplifier stage 300 is a first differential amplifier 310. The first differential amplifier 310 comprises a first non-inverting differential amplifier input 311, a first inverting differential amplifier input 312, a first non-inverting differential amplifier output 313, and a first inverting differential amplifier output 314. The first differential amplifier 310 is configured to operate either in class A mode or in class AB mode so that signals with small amplitudes as well as signals with medium amplitudes received at the first non-inverting differential amplifier input 311 and the inverting differential amplifier input 312 are amplified substantially without distortion.

In the aspect of the present disclosure the first peak amplifier stage 400 is a second differential amplifier 410. The second differential amplifier 410 comprises a second non-inverting differential amplifier input 411, a second inverting differential amplifier input 412, a second non-inverting differential amplifier output 413, and a second inverting differential amplifier output 414. The second differential amplifier 410 is configured to operate in class C mode so that input signals with small amplitudes and input signals with medium amplitudes received at the second non-inverting differential amplifier input 311 and the second inverting differential amplifier input 312 are below the second differential amplifiers bias and thus are not substantially amplified. Only input signals with relatively large amplitudes that are above the bias are amplified without substantially distortions.

The first signal splitter output 202 is connected to the first non-inverted differential amplifier input 311 of the first differential amplifier 310. The third signal splitter output 204 is connected to the first inverted differential amplifier input 312 of the first differential amplifier 310. Thus the first differential amplifier 310 is provided with input signals that are 180° apart in phase. The second signal splitter output 203 is connected to the second non-inverted differential amplifier input 411 of the second differential amplifier 410. The fourth signal splitter output 205 is connected to the second inverted differential amplifier input 412 of the second differential amplifier 410. Thus the second differential amplifier 410 is also provided with input signals that are 180° apart in phase. This arrangement further ensures that the signals amplified by the first differential amplifier and the second differential amplifier are ideally 90° or 270° respectively apart in phase, as known from arrangements with a single carrier amplifier and a single peak amplifier.

The arrangement with the first differential amplifier 310 and the second differential amplifier 320 consequently provides a non-inverted carrier amplifier signal at the first non-inverting differential amplifier output 313, a inverted carrier amplifier signal at the first inverted differential amplifier output 314, a non-inverted peak amplifier signal provided at the second differential amplifier output 413 and a inverted peak amplifier output signal provided at the second differential amplifier output 414. Ideally the peak amplifier stage 300 and the peak amplifier stage 400 are dimensioned in a way that the amplified carrier signals (the non-inverted carrier amplifier signal and the inverted carrier amplifier signal) and the amplified peak amplifier signals (the non-inverted peak amplifier signal and the inverted peak amplifier output signal) complement after recombination of the four signals (the non-inverted carrier amplifier signal, the inverted carrier amplifier signal, the non-inverted peak amplifier signal, and the inverted peak amplifier output signal) to a single, substantially linear Doherty amplifier output signal 103. Among other advantages a Doherty amplifier provides a Doherty amplifier output signal 103 with higher output power compared to a single stage amplifier powered with a comparable supply voltage In the aspect of the present disclosure the signal combiner 500 is formed by a first inductor 510 with a first inductor terminal and a second inductor terminal; a second inductor 530 with a third inductor terminal and a fourth inductor terminal; a first capacitor 520 with a first capacitor terminal and a second capacitor terminal; a second capacitor 540 with a third capacitor terminal and fourth capacitor terminal; and a signal coupler 550. The first inductor terminal of the first inductor 510 forms a first signal combiner input 501. The second inductor terminal of the first inductor 510 is connected to the first capacitor terminal of the first capacitor 520 and forms at the same time a second signal combiner input 502. The second capacitor terminal of the first capacitor 520 is connected to the third inductor terminal of the second inductor 530 and forms at the same time a third signal combiner input 503. The fourth inductor terminal of the second inductor 530 is connected to the third capacitor terminal of the second capacitor 540 and forms at the same time a fourth signal combiner input 504. The fourth capacitor terminal of the second capacitor 540 is connected to the first inductor terminal of the first inductor 510 and thus closes the ring of a L-C-L-C network.

A first signal coupler input 551 of the signal coupler 550 is connected to the second terminal of the first capacitor 520 and a second signal coupler input 552 of the signal coupler 550 is connected to the fourth impedance terminal of the second capacitor 540. A signal coupler output 553 of the signal coupler 550 forms the output of the signal combiner 500 and at the same time the amplifier arrangement output 103. The signal coupler 550 is just a device for converting a balanced signal into an unbalanced signal. This task may be achieved by different elements such as a impedance matching network, or as will be shown in FIG. 3 and FIG. 4 by electromagnetic converters, such as a balun.

In the aspect of the present disclosure the first non-inverted differential amplifier output 313 is connected first signal combiner input 501, the first inverted differential amplifier output 314 is connected to the third signal combiner input 502, the second non-inverted differential amplifier output 413 is connected to the second signal combiner input 503, and the second inverted differential amplifier output 414 is connected to the fourth signal combiner input 504. In this configuration the phase shifts added by the first inductor 510, the first capacitor 520, the second inductor 530, and the second capacitor 540 ideally compensate the phase differences between the non-inverted carrier amplifier signal, the inverted carrier amplifier signal, the non-inverted peak amplifier signal, and the inverted peak amplifier output signal.

In this aspect of the present disclosure the signal coupler 550 is a 180°-hybrid coupler. So-called hybrid couplers are a special case of a four-port directional coupler that are designed for equal power splitting or power combination. The hybrid couplers come in two types: 90 degree hybrids (also called quadrature hybrids) and 180 degree hybrids. In the case of the 180 degree hybrid, a signal provided at the first port 551 is delayed by 180° in phase in relation to a signal provided at the second port 552 before both signals (the signal received at the first signal coupler input 551 and the signal received at the second signal coupler input are combined and the combined signal is provided at the signal coupler output 553.

Simulations carried out by the inventor show that load modulation over frequency improve in comparison to Doherty amplifiers comprising a single carrier amplifier output signal and a single peak amplifier signal, if the Doherty amplifier arrangement 1 comprises two carrier amplifier output signals, each carrier amplifier output signal 180° apart in phase from each other, and if the Doherty amplifier further comprises two carrier amplifier output signals, each amplifier output signal also 180° apart in phase. More than one carrier amplifier output signal and more than one peak amplifier output signal enable distributed input signals and distributed output signals. Whereas the prior art Doherty amplifier arrangement works satisfactorily at only around ±5% of a center frequency, the Doherty amplifier arrangement 1 works almost ideally up to around ±20% of the center frequency, especially at low and medium power levels. This increased range is advantageous since gain versus power characteristic at the point where the peaking "kicks in" can be severely distorted by inaccurate load impedance at these lower power levels, which increases ACPR and might make sufficient DPD impossible. This range of power levels has the highest probability density for applications of the presented Doherty amplifier arrangement in mobile communication systems, as in the mobile communication system the radio signals in the range where the carrier amplifier is operated occur much more often than the radio signals in the peak power range.

Figure 2:
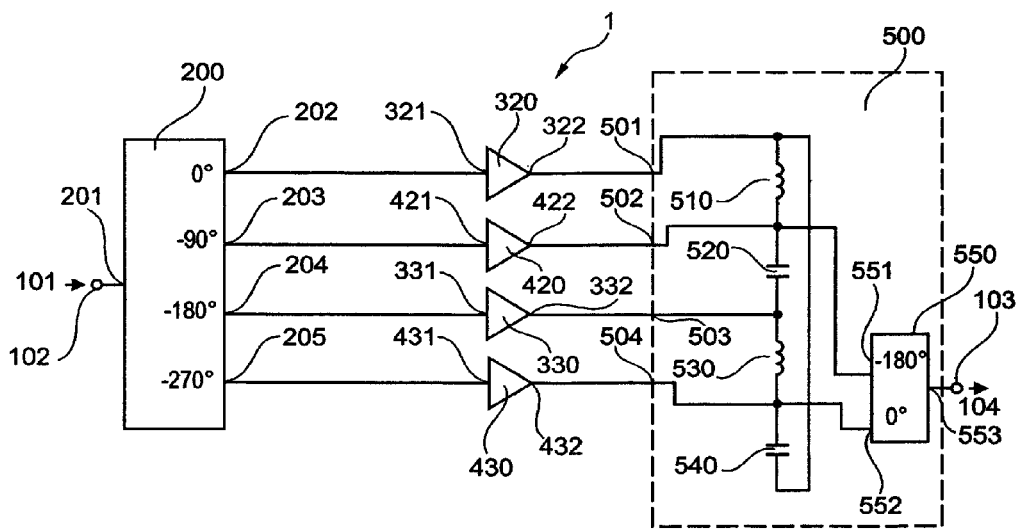
FIG. 2 shows a further aspect of the Doherty amplifier according to the present disclosure

FIG. 2 shows another aspect of the present disclosure. The Doherty amplifier arrangement 1 is similar to the Doherty amplifier arrangement 1 shown in FIG. 1 and the same reference numbers are used as in FIG. 1 for identical objects. The Doherty amplifier arrangement 1 of FIG. 2 comprises a signal splitter 200, a first carrier amplifier 320, a first peak amplifier 420, a second carrier amplifier 330, a second peak amplifier 440, and a signal combiner 500. The first carrier amplifier 320 and the second carrier amplifier 330 form a carrier amplifier stage 300; the first peak amplifier 420 and the second peak amplifier 430 form a peak amplifier stage 400.

A signal splitter input 201 is connected to a Doherty amplifier arrangement input 102 for receiving a radio signal 101. The signal splitter 201 splits the radio signal 101 into a first signal component provided at a first signal splitter output 202, a second signal component provided at a second signal splitter output 203, a third signal component provided at a third signal splitter output 204 and a fourth signal component provided at a fourth signal splitter output 205. The first signal component, the second signal component, the third signal component, and the fourth signal component are identical apart that they differ in their phase: the second signal component shows ideally a phase delay of 90° in relation to the first signal component, the third signal component shows ideally a phase delay of 180° in relation to the first signal component, and the fourth signal component shows ideally a phase delay of 270° in relation to the first signal component.

The first carrier amplifier 320 is connected with a first carrier amplifier input 321 to the first signal splitter output 202. The first carrier amplifier 320 provides an amplified first signal component at a first carrier amplifier output 322. The first peak amplifier 420 is connected with a first peak amplifier input 421 to the second signal splitter output 203. The first peak amplifier 420 provides an amplified second signal component at a first peak amplifier output 422. The second carrier amplifier 330 is connected with a second carrier amplifier input 331 to the third signal splitter output 204. The second carrier amplifier 330 provides an amplified third signal component at a second carrier amplifier output 332. The second peak amplifier 430 is connected with a second peak amplifier input 431 to the fourth signal splitter output 205. The second peak amplifier 430 provides an amplified fourth signal component at a second peak amplifier output 432.

The first carrier amplifier output 322 is connected to a first signal combiner input 501 of the signal combiner 500. The second peak amplifier output 431 is connected to a second signal combiner input 502 of the signal combiner 500. The second peak amplifier output 332 is connected to a third signal combiner input 503 of the signal combiner 500. The second peak amplifier output 432 is connected to a fourth signal combiner input 504 of the signal combiner 500. The signal combiner 500 combines a signal received at the first signal combiner input 501, a signal received at the second signal combiner input 502, a signal received at the third signal combiner input 503, and a signal received at the fourth signal combiner input 504 into a single output signal provided at the signal combiner output 505. Hereby the signal received at the first signal combiner input 501 is delayed by 270° in relation to the phase of the signal received a the fourth signal combiner input 504. The signal received at the second signal combiner input 502 is delayed by 180° in relation to the phase of the signal received a the fourth signal combiner input 504. The signal received at the third signal combiner input 503 is delayed by 90° in relation to the phase of the signal received a the fourth signal combiner input 504. By this arrangement the phase shifts introduced by the signal splitter 200 are compensated and the amplified first signal component, the amplified second signal component, the amplified third signal component, and the amplified fourth signal component are recombined in-phase.

In another aspect of the present disclosure shown in FIG. 3 the signal splitter comprises a first balun 260, a first λ/4-delay line 270, and second λ/4-delay line 280. A first carrier amplifier is idealized by a first transistor 340, a first peak amplifier that is idealized by a second transistor 440, a second carrier amplifier that is idealized by a third transistor 350, a second peak amplifier that is idealized by a fourth transistor 450.

The Doherty amplifier input 102 is connected to a first unbalanced port 261 of the first balun 260. The first balanced port 262 of the first balun 260 is connected directly to a first base of the first transistor 340 and a first λ/4-delay line terminal of the first λ/4-delay line 270. A second λ/4-delay line terminal of the first λ/4-delay line 270 is connected to a second base of the second transistor 440. The second balanced port 263 of the first balun 260 is connected directly to a third base of the third transistor 350 and a second λ/4-delay line terminal of the second λ/4-delay line 280. A fourth λ/4-delay line terminal of the fourth λ/4-delay line 280 is connected to a second base of the fourth transistor 450.

A balun is a type of electrical transformer that can convert electrical signals received at an unbalanced port to signals provided at a first balanced port and a second balanced port and vice versa. Although baluns always use electromagnetic coupling for their operation they can take many forms and are also available as surface mounted devices (SMD). In this aspect of the present disclosure using the baluns comes in handy as the signals provided at the first balanced port and the second balanced port are 180° apart in phase. In the event the balun is used to combine the signals received at the first balanced port and at the second balanced the signal received at a second balanced port is delayed by a 180° in phase in relation to the signal received at the second balanced port. The balun may be a 90° Guanella-type inverter.

The first λ/4-delay 260 and the second λ/4-delay line 270 are chosen such that the wavelength λ equals the wavelength of the carrier signal of the modulated radio signal 101. By this the phase of a signal passing the first λ/4-delay line 270 or passing the second λ/4-delay line 280 is retarded by 90° in phase.

If we add the delays introduced by the first balun 260 and the first first λ/4-delay 260 and the second λ/4-delay line 270 we arrive at the same signal delays as presented in the first aspect of the present disclosure. In the following the signal received at the first base of the first transistor 340 is taken as a reference signal. Due to the first λ/4-delay line 270 the signal received at the second base of the second transistor 430 is delayed by 90° in phase in relation to the signal received at the first base of the first transistor 340. As the third signal received at the third base of the third transistor 350 passed the first balun 260 from the first unbalanced port to the second balanced port, the third signal received at the third base of the third transistor 350 is delayed by 180° in phase in relation to the first signal received at the first base of the first transistor 340. Due to the 180° signal delay in the first balun 260 and the second λ/4-delay line 280 the fourth signal received at the fourth base of the fourth transistor 450 is delayed in total by 270° in phase in relation to the first signal received at the first base of the first transistor 340.

A first emitter of the first transistor 340, a second emitter of the second transistor 440, a third emitter of the third transistor 350, and a fourth emitter of the fourth transistor 450 is connected to a reference level. As the idealized first transistor 340, the idealized second transistor 440, the idealized third transistor 350, and the idealized fourth transistor 450 just represent an amplifier consisting of only one or little more than one real discrete transistors, the person skilled in the art will appreciate and will know how to dimension the real transistors and how to bias the transistors in order to make the idealized first transistor 340 and the idealized third transistor 350 work as carrier amplifier stages and to make the second idealized transistor 440 and the fourth idealized transistor 450 work as peak amplifier stages. The person skilled in the art will also appreciate if or if not for the design he chooses other known elements, such as choke inductance to apply collector voltage, have to be added.

A first collector of the first transistor 340 idealizes a first carrier amplifier output. The first collector of the first transistor 340 is connected to a first combiner input 501. A second collector of the second transistor 440 idealizes a first carrier amplifier stage output. The second collector of the second transistor 440 is connected to a second combiner input 502. A third collector of the third transistor 350 idealizes a second carrier amplifier stage output. The third collector of the third transistor 350 is connected to a third combiner input 503. A fourth collector of the fourth transistor 450 idealizes a second peak amplifier stage output. The fourth collector of the fourth transistor 450 is connected to a fourth combiner input 504.

In this aspect of the present disclosure the signal combiner 500 is again formed by a first inductor 510 with a first inductor terminal and a second inductor terminal; a second inductor 530 with a third inductor terminal and a fourth inductor terminal; a first capacitor 520 with a first capacitor terminal and a second capacitor terminal; a second capacitor 540 with a third capacitor terminal and fourth capacitor terminal; and a signal coupler 550. The first inductor terminal of the first inductor 510 forms the first signal combiner input 501. The second inductor terminal of the first inductor 510 is connected to the first capacitor terminal of the first capacitor 520 and forms at the same time the second signal combiner input 502. The second capacitor terminal of the first capacitor 520 is connected to the third inductor terminal of the second inductor 530 and forms at the same time the third signal combiner input 503. The fourth inductor terminal of the second inductor 530 is connected to the third capacitor terminal of the second capacitor 640 and forms at the same time the fourth signal combiner input 504. The fourth capacitor terminal of the second capacitor 540 is connected to the first inductor terminal of the first inductor 510 and thus closes the ring of a L-C-L-C network.

The second signal combiner input 502 is directly connected to a third balanced port of a second balun 560. The fourth signal combiner input 504 is directly connected to a fourth balanced port 562 of the second balun 560. As described earlier signals received at balanced inputs of a balun are combined with a 180° phase delay. Thus the signal originating from the second signal combiner input 502 and originating from the fourth signal combiner input 504 are re-combined in-phase by the second balun 560.

The balun may be implemented as a band-pass filter with a differential band-pass filter input and a single ended band-pass filter output. The balun may also be implemented as an impedance transformer with a differential impedance transformer input and a single-ended impedance transformer output.

In the present disclosure the four transistors (the first transistor 330, the second transistor 340, the third transistor 430, the fourth transistor 440) are all bipolar transistors of NPN type. However, the person skilled in the art will appreciate that in principle the present disclosure will also work with transistors of PNP type. The person skilled in the art will further readily appreciate that this aspect of the disclosure is applicable to any type of transistors, such as heterojunction bipolar transistors (HBT) and high electron mobility transistors (HEMT), or field effect transistors.

In the third aspect of the present disclosure depicted in FIG. 3 the signal coupler, e.g. the second balun 560 combines the signals originating from the second signal combiner input 502 and the fourth signal combiner input 504 into the Doherty amplifier output signal 104. In contrast to the third aspect of the present disclosure in the fourth aspect of the present disclosure, depicted in FIG. 4, the second balun 560 combines the signals originating from the third signal combiner input 503 and originating from the first signal combiner input 501.

This arrangement is useful for example in case some or all of the amplifier stages (e.g. the first collector path of the first transistor 340, the second first collector path of the second transistor 440, the third first collector path of the third transistor 350, the fourth first collector path of the fourth transistor 450) introduce a non negligible signal delay, i.e. by a big drain capacity. In order to compensate for such signal delays the first collector of the first transistor 340 is connected via a third delay line 610 to the first signal combiner input 501. The delay introduced by the third delay line 610 is dimensioned to sum up with the signal delay of the first collector path of the first transistor 340 to a predetermined delay, such as a delay of $\lambda/4$. The second collector of the second transistor 440 is connected via a fourth delay line 620 to the second signal combiner input 502. The delay introduced by the fourth delay line 620 is dimensioned to sum up with the signal delay of the second collector path of the second transistor 440 to a predetermined delay, such as a delay of $\lambda/4$. The third collector of the third transistor 350 is connected via a fifth delay line 630 to the third signal combiner input 503. The delay introduced by the fifth delay line 630 is dimensioned to sum up with the signal delay of the third collector path of the third transistor 350 to a predetermined delay, such as a delay of $\lambda/4$. The fourth collector of the fourth transistor 450 is connected via a fourth delay line 640 to the fourth signal combiner input 504. The delay introduced by the fourth delay line 640 is dimensioned to sum up with the signal delay of the fourth collector path of the fourth transistor 440 to a predetermined delay such as a delay of $\lambda/4$.

Figure 5:
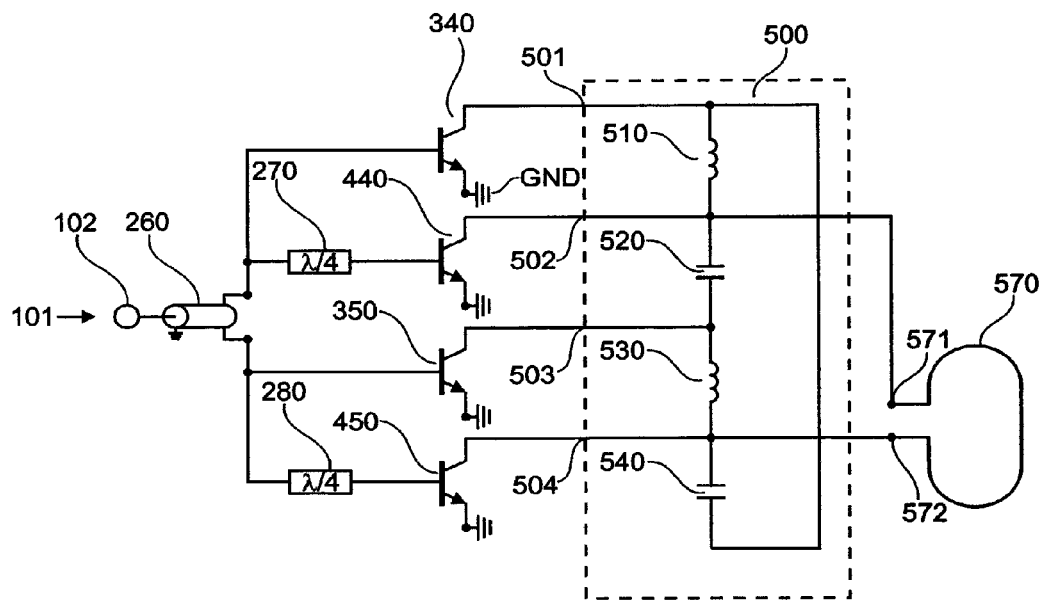
FIG. 5 shows yet another aspect of a Doherty amplifier according to the present disclosure

The so far presented aspects of the present disclosure were using a signal coupler 550 or a balun 560 for providing a non-symmetrical output signal. In another aspect of the present disclosure presented in FIG. 5 a symmetrical load, e.g. a symmetrical antenna 570 is connected directly connected to a signal combiner 500. The Doherty amplifier arrangement 1 depicted in FIG. 5 is similar to the Doherty amplifier arrangement shown in FIG. 3 and therefore same reference numbers are used as in FIG. 3 for identical objects. A first antenna terminal 571 is connected directly to the second signal combiner input 502 and a second antenna terminal 572 is connected to the fourth signal combiner input 504.

Figure 6:
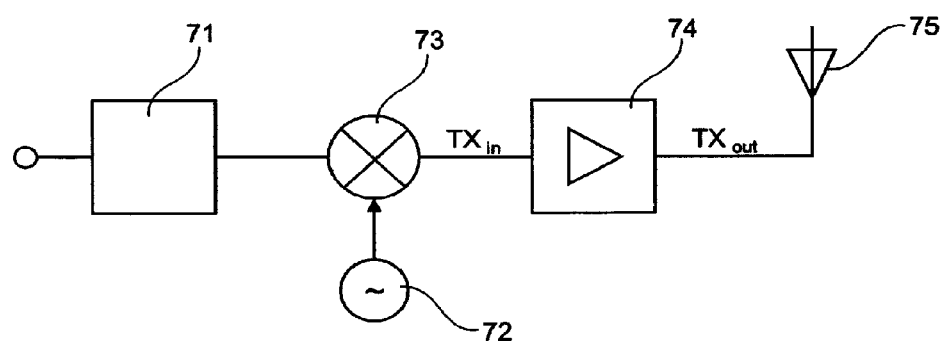
FIG. 6 shows an application of a Doherty amplifier according to the present disclosure in an active antenna system

FIG. 6 shows another aspect of the present disclosure as the use of the amplifier arrangement in a radio station. The radio station may for example be part of an antenna array system for the mobile communications network. As this aspect of the present disclosure relates only to the transmitting part of the radio station, only the transmitting part is shown, although the person skilled in the art will appreciate that the radio station for the mobile communications network will also include circuit arrangements for receiving the radio signal. For reasons of clarity only some of the components are illustrated in FIG. 6. In the context of this disclosure the radio station is part of but is not limited to a base transceiver station, as known from GSM networks, as well as a node B (known from UMTS/3G networks) or enhanced node B, and similar units used in other mobile communication network.

A base band signal, which comprises encoded data, e.g. encoded voice data, is modulated in an I/Q-modulator 71. The modulated signal is mixed with a radio frequency signal from a synthesized local oscillator 72 in an up-converter 73 and passed to a power amplifier 74 as a transmit input signal $TX_{in}$. The amplified radio signal $TX_{out}$ is passed to an antenna 75. The power amplifier 74 in this aspect of the present disclosure comprises the Doherty amplifier arrangement 1 described in the present disclosure.

The various aspects of the present disclosure presented in FIG. 1 to FIG. 6 may be implemented as different specific hardware implementations, such as an integrated circuit (IC) integrated in one chip or spread out over a plurality of chips, a module, e.g. one or more semiconductor dies and passive components (splitter, combiner, inductors, capacitors, . . . ) integrated into a package, a hybrid or printed circuit board (PCB), e.g. one or more semiconductor dies and passive components (splitter, combiner, inductors, capacitors, . . . ) all assembled on a printed circuit board (PCB).

The present disclosure further relates to a computer program product embedded on a computer readable medium. The computer program product comprises executable instructions for the manufacture of the Doherty amplifier arrangement 1 of the present disclosure.

In addition to using hardware (e.g., within or coupled to a Central Processing Unit ("CPU"), microprocessor, microcontroller, digital signal processor, processor core, System on chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets. It is understood that the apparatus and method described herein may be included in a semiconductor intellectual property core, such as a microprocessor core (e.g., embodied in HOL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

While various embodiments of the present invention have been described above, it should be understood that they have been presented by way of example, and not limitation. It will be apparent to persons skilled in the relevant arts that various changes in form and detail can be made therein without departing from the scope of the invention. The person skilled in the art will for example appreciate that the carrier signals and the peak signals may be arranged in a different order, as long as the order in which they are recombined allows an in-phase recombination. The person skilled in the art will also appreciate that depending on a specific choice of elements input impedance matching network or/and output impedance matching network may have to be added. Thus, the present invention should not be limited by any of the above-described exemplary embodiments, but should be defined only in accordance with the following claims and their equivalents.

The invention claimed is:

1. A Doherty amplifier arrangement having an input terminal for receiving an input signal and having at least one output terminal for providing an amplified signal of the input signal, further comprising:
   a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component,
   a carrier amplifier comprising a first carrier amplifier input, a second carrier amplifier input, a first carrier amplifier output for providing a first carrier amplifier output signal, and a second carrier amplifier output for providing a second carrier amplifier output signal,
   a peak amplifier comprising a first peak amplifier input, a second peak amplifier input, a first peak amplifier output for providing a first peak amplifier output signal, and a second peak amplifier output for providing a second peak amplifier output signal
   a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein
   the second inductor terminal is connected to the first capacitor terminal,
   the second capacitor terminal is connected to the third inductor terminal, the fourth inductor terminal is connected to the third capacitor terminal,
   the fourth capacitor terminal is connected to the first inductor terminal.

2. The amplifier arrangement according to claim 1, wherein
   the carrier amplifier is a first differential amplifier comprising
      a first non-inverting input that corresponds to the first carrier amplifier input,
      a first inverting input that corresponds to the second carrier amplifier input,
      a first non-inverting output that corresponds to the first carrier amplifier output,
      a first inverting output that corresponds to the second carrier amplifier output;
   the peak amplifier is a second differential amplifier comprising
      a second non-inverting input that corresponds to the first peak amplifier input,
      a second inverting input that corresponds to the second peak amplifier input,
      a second non-inverting output that corresponds to the first peak amplifier output,
      a second inverting output that corresponds to the second peak amplifier output.

3. The amplifier arrangement according to claim 1, wherein
   the carrier amplifier comprises a first carrier amplifier device providing a first carrier amplifier output and the carrier amplifier further comprises a second carrier amplifier device providing a second carrier amplifier output
   the peak amplifier comprises a first peak amplifier device providing a first peak amplifier output and the peak amplifier further comprises a second peak amplifier device, providing a second peak amplifier output.

4. The amplifier arrangement according to claim 1, comprising a differential antenna with a first antenna input and a second antenna input whereby the first antenna input is connected to the first capacitor terminal and the second antenna input is connected to the third capacitor terminal.

5. The amplifier arrangement according to claim 1 further comprising a 180°-combiner with a first 180°-combiner input and a second 180°-combiner input whereby the first 180°-combiner input is connected to the first capacitor terminal and the second 180°-combiner input is connected to the third capacitor terminal.

6. The amplifier arrangement according to claim 5 wherein the 180°-combiner is a 180°-hybrid coupler or a balun.

7. The Doherty amplifier according to claim 6 wherein a signal combiner balun comprises a first signal combiner balun input, a second combiner balun input and a signal combiner balun output, wherein
the first signal combiner balun input is connected to the first capacitor terminal and the second combiner balun input is connected to the third capacitor terminal.

8. The Doherty amplifier according to claim 6 wherein the balun is implemented as a impedance transformer with a differential impedance transformer input and a single-ended impedance transformer output.

9. A method for amplifying a radio signal by a Doherty amplifier, the method comprises
splitting the radio signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component,
amplifying the first signal component by a carrier amplifier providing a first amplified carrier signal
amplifying the third signal component by the carrier amplifier providing a second amplified carrier signal
amplifying the second signal component by a peak amplifier providing a first amplified peak signal
amplifying the fourth signal component providing a second amplified peak signal
combining the first amplified carrier signal, the second amplified carrier signal, the first amplified peak signal, and the second amplified peak signal in-phase by a circular arrangement of a first inductor, a first capacitor, a second inductor, and a second capacitor.

10. A chip set comprising a Doherty amplifier arrangement having an input terminal for receiving an input signal and having at least one output terminal for providing an amplified signal of the input signal, further comprising:
a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component,
a carrier amplifier comprising a first carrier amplifier input, a second carrier amplifier input, a first carrier amplifier output for providing a first carrier amplifier output signal, and a second carrier amplifier output for providing a second carrier amplifier output signal,
a peak amplifier comprising a first peak amplifier input, a second peak amplifier input, a first peak amplifier output for providing a first peak amplifier output signal, and a second peak amplifier output for providing a second peak amplifier output signal
a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein
the second inductor terminal is connected to the first capacitor terminal,
the second capacitor terminal is connected to the third inductor terminal,
the fourth inductor terminal is connected to the third capacitor terminal,
the fourth capacitor terminal is connected to the first inductor terminal.

11. An active antenna array comprising at least one A Doherty amplifier arrangement having an input terminal for receiving an input signal and having at least one output terminal for providing an amplified signal of the input signal, further comprising:
a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component,
a carrier amplifier comprising a first carrier amplifier input, a second carrier amplifier input, a first carrier amplifier output for providing a first carrier amplifier output signal, and a second carrier amplifier output for providing a second carrier amplifier output signal,
a peak amplifier comprising a first peak amplifier input, a second peak amplifier input, a first peak amplifier output for providing a first peak amplifier output signal, and a second peak amplifier output for providing a second peak amplifier output signal
a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein
the second inductor terminal is connected to the first capacitor terminal,
the second capacitor terminal is connected to the third inductor terminal,
the fourth inductor terminal is connected to the third capacitor terminal,
the fourth capacitor terminal is connected to the first inductor terminal.

12. A method for manufacturing a Doherty amplifier arrangement, the Doherty amplifier arrangement having an input terminal for receiving an input signal and having at least one output terminal for providing an amplified signal of the input signal, further comprising:
a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component, a carrier amplifier comprising a first carrier amplifier input, a second carrier amplifier input, a first carrier amplifier output for providing a first carrier amplifier output signal, and a second carrier amplifier output for providing a second carrier amplifier output signal, a peak amplifier comprising a first peak amplifier input, a second peak amplifier input, a first peak amplifier output for providing a first peak amplifier output signal, and a second peak amplifier output for providing a second peak amplifier output signal a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein the second inductor terminal is connected to the first capacitor terminal, the second capacitor terminal is connected to the third inductor terminal, the fourth inductor terminal is connected to the third capacitor terminal, the fourth capacitor terminal is connected to the first inductor terminal.

13. A computer program product comprising a non-transitory computer-usable medium having control logic stored therein for causing a computer to manufacture a Doherty amplifier arrangement, the Doherty amplifier arrangement having an input terminal for receiving an input signal and having at least one output terminal for providing an amplified signal of the input signal, further comprising:

a signal splitter for splitting the input signal into a first signal component, a second signal component that is substantially 90° apart in phase in relation to the first signal component, a third signal component that is substantially 180° apart in phase in relation to the first signal component and a fourth signal component, that is substantially 270° apart in phase in relation to the first signal component, a carrier amplifier comprising a first carrier amplifier input, a second carrier amplifier input, a first carrier amplifier output for providing a first carrier amplifier output signal, and a second carrier amplifier output for providing a second carrier amplifier output signal, a peak amplifier comprising a first peak amplifier input, a second peak amplifier input, a first peak amplifier output for providing a first peak amplifier output signal, and a second peak amplifier output for providing a second peak amplifier output signal a signal combiner for combining the first carrier amplifier output signal, the second carrier amplifier output signal, the first peak amplifier output signal, and the second peak amplifier output signal in phase, whereby the signal combiner comprises a first inductor with a first inductor terminal and a second inductor terminal, a first capacitor with a first capacitor terminal and a second capacitor terminal, a second inductor with a third inductor terminal and a fourth inductor terminal, a second capacitor with a third capacitor terminal and a fourth capacitor terminal wherein the second inductor terminal is connected to the first capacitor terminal, the second capacitor terminal is connected to the third inductor terminal, the fourth inductor terminal is connected to the third capacitor terminal, the fourth capacitor terminal is connected to the first inductor terminal.

* * * * *